United States Patent [19]
Nakamura et al.

[11] Patent Number: 5,539,215
[45] Date of Patent: Jul. 23, 1996

[54] SUPERCONDUCTING DEVICE HAVING AN EXTREMELY THIN SUPERCONDUCTING CHANNEL FORMED OF OXIDE SUPERCONDUCTOR MATERIAL

[75] Inventors: Takao Nakamura; Hiroshi Inada; Michitomo Iiyama, all of Osaka, Japan

[73] Assignee: Sumitomo Electric Industries, Ltd., Osaka, Japan

[21] Appl. No.: 366,381

[22] Filed: Dec. 29, 1994

Related U.S. Application Data

[63] Continuation of Ser. No. 990,831, Dec. 14, 1992, abandoned.

[30] Foreign Application Priority Data

| Dec. 13, 1991 | [JP] | Japan | 3-352193 |
| Dec. 13, 1991 | [JP] | Japan | 3-352194 |
| Dec. 13, 1991 | [JP] | Japan | 3-352197 |
| Dec. 20, 1991 | [JP] | Japan | 3-355187 |
| Dec. 10, 1992 | [JP] | Japan | 4-352659 |

[51] Int. Cl.[6] .................... H01L 29/06; H01B 12/00; B05D 5/12
[52] U.S. Cl. .................... 257/39; 257/34; 257/35; 257/36; 505/193; 505/234; 505/237; 505/239; 427/62; 427/63
[58] Field of Search ................ 505/1, 700, 701, 505/702, 193, 234, 237–239; 427/62, 63; 257/36, 39, 34, 35

[56] References Cited

FOREIGN PATENT DOCUMENTS

| 0280308 | 8/1988 | European Pat. Off. . |
| 0324044 | 7/1989 | European Pat. Off. ............ 257/39 |
| 0477103 | 3/1992 | European Pat. Off. . |
| 0478465 | 4/1992 | European Pat. Off. . |
| 0505259 | 9/1992 | European Pat. Off. . |
| 1-170080 | 7/1989 | Japan ............................. 257/39 |

OTHER PUBLICATIONS

Wu et al. "High Critical Currents in Epitaxial Y Ba Cu O Thin Films on Silicon with Buffer Layers," Appl. Phys. Lett., vol. 54, No. 8, 20 Feb. 1989, pp. 754–756.

Olsson et al, "Crack Formation in Epitaxial [110] Thin Films Of YBaCuO And PrBaCuO on [110] SrTiO$_3$ Substrates," Appl. Phys. Lett., vol. 58, No. 15, 15 Apr. 1991, pp. 1682–1684.

Tarutani, Y., et al., "Superconducting Characteristics of a Planar–type $HoBa_2Cu_3O_{7-x}$–$La_{1.5}Ba_{1.5}Cu_3O_{7-y}$–$HoBa_2Cu_3O_{7-x}$ junction", Applied Physics Letters, vol. 58, No. 23, pp. 2707–2709, Jun. 10, 1991.

Moore, D. F., et al., "Superconducting Thin Films for Device Applications (Invited), 2nd Workshop on High Temperature Superconducting Electron Devices", pp. 281–284, Jun. 7–9, 1989.

Primary Examiner—Mahshid Saadat
Attorney, Agent, or Firm—Foley & Lardner

[57] ABSTRACT

A superconducting device comprising a substrate having a principal surface, a non-superconducting oxide layer having a similar crystal structure to that of the oxide superconductor, a first and a second superconducting regions formed of c-axis oriented oxide superconductor thin films on the non-superconducting oxide layer separated from each other and gently inclining to each other, a third superconducting region formed of an extremely thin c-axis oriented oxide superconductor thin film between the first and the second superconducting regions, which is continuous to the first and the second superconducting regions.

16 Claims, 9 Drawing Sheets

SUPERCONDUCTING DEVICE HAVING AN EXTREMELY THIN SUPERCONDUCTING CHANNEL FORMED OF OXIDE SUPERCONDUCTOR MATERIAL

This application is a continuation of application Ser. No. 07/990,831, filed Dec. 14, 1992, now abandoned.

BACKGROUND OF THE INVENTION

1. Field of the Invention

The present invention relates to a superconducting device and a method for manufacturing the same, and more specifically to a superconducting device having an extremely thin superconducting channel formed of oxide superconductor material, and a method for manufacturing the same.

2. Description of Related Art

Devices which utilize superconducting phenomena operate rapidly with low power consumption so that they have higher performance than conventional semiconductor devices. Particularly, by using an oxide superconducting material which has been recently advanced in study, it is possible to produce a superconducting device which operates at relatively high temperature.

Josephson device is one of well-known superconducting devices. However, since Josephson device is a two-terminal device, a logic gate which utilizes Josephson devices becomes complicated configuration. Therefore. three-terminal superconducting devices are more practical.

Typical three-terminal superconducting devices include two types of super-FET (field effect transistor). The first type of the super-FET includes a semiconductor channel, and a superconductor source electrode and a superconductor drain electrode which are formed closely to each other on both side of the semiconductor channel. A portion of the semiconductor layer between the superconductor source electrode and the superconductor drain electrode has a greatly recessed or undercut rear surface so as to have a reduced thickness. In addition, a gate electrode is formed through a gate insulating layer on the portion of the recessed or undercut rear surface of the semiconductor layer between the superconductor source electrode and the superconductor drain electrode.

A superconducting current flows through the semiconductor layer (channel) between the superconductor source electrode and the superconductor dram electrode due to the superconducting proximity effect, and is controlled by an applied gate voltage. This type of the super-FET operates at a higher speed with a low power consumption.

The second type of the super-FET includes a channel of a superconductor formed between a source electrode and a drain electrode, so that a current flowing through the superconducting channel is controlled by a voltage applied to a gate formed above the superconducting channel.

Both of the super-FETs mentioned above are voltage controlled devices which are capable of isolating output signal from input one and of having a well defined gain.

However, since the first type of the super-FET utilizes the superconducting proximity effect, the superconductor source electrode and the superconductor drain electrode have to be positioned within a distance of a few times the coherence length of the superconductor materials of the superconductor source electrode and the superconductor drain electrode. In particular, since an oxide superconductor has a short coherence length, a distance between the superconductor source electrode and the superconductor drain electrode has to be made less than about a few ten nanometers, if the superconductor source electrode and the superconductor drain electrode are formed of the oxide superconductor material. However, it is very difficult to conduct a fine processing such as a fine pattern etching, so as to satisfy the very short separation distance mentioned above.

On the other hand, the super-FET having the superconducting channel has a large current capability, and the fine processing which is required to product the first type of the super-FET is not needed to product this type of super-FET.

In order to obtain a complete ON/OFF operation, both of the superconducting channel and the gate insulating layer should have an extremely thin thickness. For example, the superconducting channel formed of an oxide superconductor material should have a thickness of less than five nanometers and the gate insulating layer should have a thickness more than ten nanometers which is sufficient to prevent a tunnel current.

In the super-FET, since the extremely thin superconducting channel is connected to the relatively thick superconducting source region and the superconducting drain region at their lower portions, the superconducting current flows substantially horizontally through the superconducting channel and substantially vertically in the superconducting source region and the superconducting drain region. Since the oxide superconductor has the largest critical current density $J_c$ in the direction perpendicular to c-axes of its crystal lattices, the superconducting channel is preferably formed of a c-axis oriented oxide superconductor thin film and the superconducting source region and the superconducting drain region are preferably formed of a-axis oriented oxide superconductor thin films.

In a prior art, in order to manufacture the super-FET which has the superconducting channel of c-axis oriented oxide superconductor thin film and the superconducting source region and the superconducting drain region of a-axis oriented oxide superconductor thin films, a c-axis oriented oxide superconductor thin film is formed at first and the c-axis oriented oxide superconductor thin film is etched and removed excluding a portion which will be the superconducting channel. Then, an a-axis oriented oxide superconductor thin film is deposited so as to form the superconducting source region and the superconducting drain region.

In another prior art, at first an a-axis oriented oxide superconductor thin film is deposited and etched so as to form the superconducting source region and the superconducting drain region, and then a c-axis oriented oxide superconductor thin film is deposited so as to form the superconducting channel.

However, in the prior an,, the oxide superconductor thin film is degraded during the etching so that the superconducting characteristics is affected. In addition, the etched surface of the oxide superconductor thin film is roughened, therefore, if another oxide superconductor thin film is formed so as to contact the rough surface, an undesirable Josephson junction or a resistance is generated at the interface.

By this, the super-FET manufactured by the above conventional process does not have an enough performance.

SUMMARY OF THE INVENTION

Accordingly, it is an object of the present invention to provide a superconducting device having a superconducting region constituted of an extremely thin oxide superconductor film, which have overcome the above mentioned defects of the conventional ones.

Another object of the present invention is to provide a method for manufacturing an FET type superconducting device which have overcome the above mentioned defects of the conventional ones.

The above and other objects of the present invention are achieved in accordance with the present invention by a superconducting device comprising a substrate having a principal surface, a non-superconducting oxide layer having a similar crystal structure to that of the oxide superconductor, a first and a second superconducting regions formed of c-axis oriented oxide superconductor thin films on the non-superconducting oxide layer separated from each other and gently inclining to each other, a third superconducting region formed of an extremely thin c-axis oriented oxide superconductor thin film between the first and the second superconducting regions, which is continuous to the first and the second superconducting regions.

In the superconducting device in accordance with the present invention, upper surfaces of the first and second superconducting regions gently inclines to the third superconducting region of an extremely thin oxide superconductor thin film. Therefore, superconducting current flows into or flows from the third superconducting region efficiently so that the current capability of the superconducting device can be improved.

In a preferred embodiment, the third superconducting region forms a weak link of a Josephson junction, so that the superconducting device constitutes a Josephson device. In this case, the third superconducting region preferably includes a grain boundary which constitutes a weak link of a Josephson junction.

In another preferred embodiment, the third superconducting region forms a superconducting channel, so that superconducting current can flow between the first and second superconducting region through the third superconducting region. In this case, it is preferable that the superconducting device further includes a gate electrode formed on the third superconducting region, so that the superconducting device constitutes a super-FET, and the superconducting current flowing between the first and second superconducting region through the third superconducting region is controlled by a voltage applied to the gate electrode.

In the superconducting device in accordance with the present invention, the non-superconducting oxide layer preferably has a similar crystal structure to that of a c-axis oriented oxide superconductor thin film. In this case, the superconducting channel of a c-axis oriented oxide superconductor thin film can be easily formed.

Preferably, the above non-superconducting oxide layers is formed of a $Pr_1Ba_2Cu_3O_{7-\epsilon}$ oxide. A c-axis oriented $Pr_1Ba_2Cu_3O_{7-\epsilon}$ thin film has almost the same crystal lattice structure as that of a c-axis oriented oxide superconductor thin film. It compensates an oxide superconductor thin film for its crystalline incompleteness at the bottom surface. Therefore, a c-axis oriented oxide superconductor thin film of high crystallinity can be easily formed on the c-axis oriented $Pr_1Ba_2Cu_3O_{7-\epsilon}$ thin film. In addition, the effect of diffusion of the constituent elements of $Pr_1Ba_2Cu_3O_{7-\epsilon}$ into the oxide superconductor thin film is negligible and it also prevents the diffusion from substrate. Thus, the oxide superconductor thin film deposited on the $Pr_1Ba_2Cu_3O_{7-\epsilon}$ thin film has a high quality.

In a preferred embodiment, the oxide superconductor is formed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

In addition, the substrate can be formed of an insulating substrate, preferably an oxide single crystalline substrate such as MgO, $SrTiO_3$, $CdNdAlO_4$, etc. These substrate materials are very effective in forming or growing a crystalline film having a high degree of crystalline orientation. However, the superconducting device can be formed on a semiconductor substrate if an appropriate buffer layer is deposited thereon. For example, the buffer layer on the semiconductor substrate can be formed of a double-layer coating formed of a $MgAl_2O_4$ layer and a $BaTiO_3$ layer if silicon is used as a substrate.

According to another aspect of the present invention, there is provided a superconducting device comprising a substrate, a non-superconducting layer formed on a principal surface of said substrate, an extremely thin superconducting channel formed of an oxide superconductor thin film on the non-superconducting layer, a superconducting source region and a superconducting drain region of a relatively thick thickness formed of the oxide superconductor at the both sides of the superconducting channel separated from each other but electrically connected through the superconducting channel, so that a superconducting current can flow through the superconducting channel between the superconducting source region and the superconducting drain region, and a gate electrode through a gate insulator on the superconducting channel for controlling the superconducting current flowing through the superconducting channel, in which the superconducting channel is connected to the superconducting source region and the superconducting drain region at the height of their middle portions.

According to still another aspect of the present invention, there is provided a superconducting device comprising a substrate having a principal surface, a non-superconducting oxide layer having a similar crystal structure to that of the oxide superconductor, two superconducting regions formed of a c-axis oriented oxide superconductor thin film separated by an insulating region positioned between them, an extremely thin superconducting region formed of a c-axis oriented oxide superconductor thin film on the insulating region, which is continuous to the two superconducting regions and forms a weak link of Josephson junction, in which the two superconducting regions and the insulating region are formed of one c-axis oriented oxide superconductor thin film which has a gently concave upper surface and of which the center portion includes much impurity so that the portion does not show superconductivity.

According to a forth aspect of the present invention, there is provided a superconducting device comprising a substrate having a principal surface, a non-superconducting oxide layer having a similar crystal structure to that of the oxide superconductor, a superconducting source region and a superconducting drain region formed of a c-axis oriented oxide superconductor thin film separated from each other, an extremely thin superconducting channel formed of a c-axis oriented oxide superconductor thin film on the non-superconducting oxide layer, which electrically connects the superconducting source region to the superconducting drain region, so that superconducting current can flow through the superconducting channel between the superconducting source region and the superconducting drain region, and a gate electrode through a gate insulator on the superconducting channel for controlling the superconducting current flowing through the superconducting channel, in which the superconducting source region and the superconducting drain region have upper surfaces gently inclined to the superconducting channel.

According to a fifth aspect of the present invention, there is provided a superconducting device comprising a substrate having a principal surface, a non-superconducting oxide layer having a similar crystal structure to that of the oxide superconductor, two superconducting regions formed of c-axis oriented oxide superconductor thin films separated from each other, an extremely thin superconducting regions formed of a c-axis oriented oxide superconductor thin film on the non-superconducting oxide layer, which continuous to the two superconducting regions and forms a weak link of a Josephson junction, in which the two superconducting regions have upper surfaces gently inclined to the weak link.

According to a sixth aspect of the present invention, there is provided a superconducting device comprising a substrate, a non-superconducting layer formed on a principal surface of said substrate, an extremely thin superconducting channel formed of an oxide superconductor thin film on the non-superconducting layer, a superconducting source region and a superconducting drain region of a relatively thick thickness formed of the oxide superconductor at the both sides of the superconducting channel separated from each other but electrically connected through the superconducting channel, so that a superconducting current can flow through the superconducting channel between the superconducting source region and the superconducting drain region, and a gate electrode through a gate insulator on the superconducting channel for controlling the superconducting current flowing through the superconducting channel, in which the superconducting channel is connected to the superconducting source region and the superconducting drain region at the height of their middle portions.

According to still another aspect of the present invention, there is provided a method for manufacturing a superconducting device, comprising the steps of forming on a principal surface of a substrate a non-superconducting oxide layer having a similar crystal structure to that of the oxide superconductor, forming a first oxide superconductor thin film having a relatively thick thickness on the non-superconducting oxide layer, etching the first oxide superconductor thin film so as to form a concave portion which is concave gently on its center portion, implanting ions to the first oxide superconductor thin film at the bottom of the concave portion so as to form an insulating region and the first oxide superconductor thin film is divided into two superconducting regions by the insulating region, and forming a second extremely thin oxide superconductor thin film on the insulating region and the two superconducting regions which is continuous to the two superconducting regions.

In one preferred embodiment, the ions which are implanted so as to form the insulating region are selected from Ga ions, Al ions, In ions, Si ions, Ba ions and Cs ions.

It is preferable that the second extremely thin oxide superconductor thin film is formed to have a grain boundary in it so as to form a weak link of Josephson junction. It is also preferable that the second extremely thin oxide superconductor thin film is formed so as to constitute a superconducting channel through which superconducting current flows between the two superconducting regions. In this case, the method further includes the steps of forming a gate insulating layer on the second extremely thin oxide superconductor thin film at a portion above the insulating region and forming a gate electrode on the gate insulating layer.

According to another aspect of the present invention, there is provided a method for manufacturing a superconducting device, comprising the steps of forming on a principal surface of a substrate a non-superconducting oxide layer having a similar crystal structure to that of the oxide superconductor, forming a first oxide superconductor thin film having a relatively thick thickness on the non-superconducting oxide layer, etching the first oxide superconductor thin film so as to divide into two superconducting regions by the insulating region which have inclined surfaces gently inclined to each other and the non-superconducting oxide layer is exposed between them, and forming a second extremely thin oxide superconductor thin film on the exposed portion of the non-superconducting oxide layer and the two superconducting regions which is continuous to the two superconducting regions.

In one preferred embodiment, the second extremely thin oxide superconductor thin film is formed to includes a grain boundary in it so as to constitute a weak link of Josephson junction. It is also preferable that the second extremely thin oxide superconductor thin film is formed so as to constitute a superconducting channel of a super-FET. In this case, the method preferably further includes the steps of forming a gate insulating layer on the second extremely thin oxide superconductor thin film at a portion above the the exposed portion of the non-superconducting oxide layer and forming a gate electrode on the gate insulating layer.

According to still another aspect of the present invention, there is provided a method for manufacturing a superconducting device, comprising the steps of forming on a principal surface of a substrate a first oxide superconductor thin film having a relatively thick thickness, forming a metal layer on the first superconductor thin film, forming a $SiO_2$ layer on the metal layer, selectively etching a center portions of the $SiO_2$ layer, the metal layer and the first oxide superconductor thin film so that the portions of the $SiO_2$ layer, the metal layer and the first oxide superconductor thin film is completely removed and a surface of the substrate is exposed so as to form a superconducting source region and a superconducting drain region separately on the substrate and a source electrode and a drain electrode respectively on the superconducting source region and the superconducting drain region, forming a non-superconductor layer having a half thickness of the superconducting source region and the superconducting drain region on the exposed surface of the substrate, forming a second extremely thin oxide superconductor thin film on the non-superconducting layer so that an extremely thin superconducting channel which is connected to the superconducting source region and the superconducting drain region at the height of the middle portions is formed on the non-superconducting layer, forming a gate insulating layer and a gate electrode stacked on the gate insulating layer on a portion of the second oxide superconductor thin film above the non-superconducting layer, and removing the $SiO_2$ layer so that the source electrode and the drain electrode are exposed.

It is preferable that the $SiO_2$ layer is removed by using a weak HF solution.

According to another aspect of the present invention, there is provided a method for manufacturing a superconducting device, comprising the steps of forming on a principal surface of a substrate.a lift-off layer, removing the lift-off layer excluding a portion at which a projecting insulating region will be formed, etching the principal surface of a substrate so that a projecting insulating region of which the cross section is a shape of a trapezoid is formed on the principal surface, forming a first oxide superconductor thin film on the principal surface and the projecting insulating region, removing the remaining lift-off layer so that the first oxide superconductor thin film is divided into a superconducting source region and a superconducting drain region and a surface of the projecting insulating region is exposed, forming a second oxide superconductor thin film on the projecting insulating region which constitutes a superconducting channel, and forming a gate insulating layer and gate electrode on the superconducting channel.

In one preferred embodiment, the lift-off layer is preferably formed of a CaO layer of which surface is covered with a Zr layer. This lift-off layer can be removed by utilizing water and following reaction:

$$CaO + H_2O \rightarrow Ca(OH)_2$$

In the above process, no reactive agent is used but water. Therefore, if the flat-top projection is formed by the above process, the substrate and the superconducting thin film are not degraded.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 1A to 1F, the process in accordance with the present invention for manufacturing the super-FET will be described.

As shown in FIG. 1 A, a MgO (100) single crystalline substrate 5 having a substantially planar principal surface is prepared.

Figure 1A:
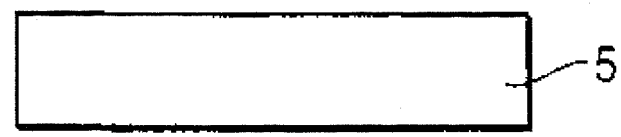
FIGS. 1A to 1F are diagrammatic sectional views for illustrating a first embodiment of the process in accordance with the present invention for manufacturing the super-FET.
Figure 1B:
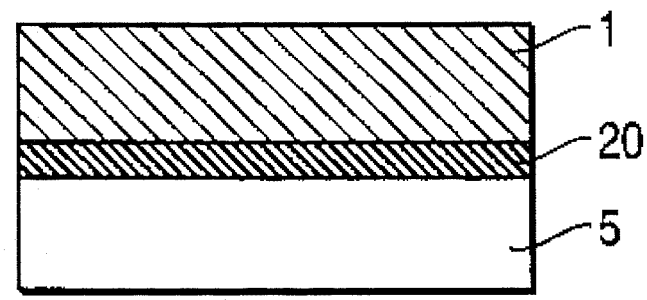

As shown in FIG. 1B, an oxide layer 20 having a thickness of 100 nanometers composed of a c-axis oriented $Pr_1Ba_2Cu_3O_{7-\epsilon}$ thin film is deposited on the principal surface of the substrate 5 and a c-axis oriented $Y_1Ba_2Cu_3O_{7-\delta}$ oxide superconductor thin film 1 having a thickness of about 300 nanometers is deposited on the oxide layer 20, by for example a sputtering, an MBE (molecular beam epitaxy), a vacuum evaporation, a CVD, etc. A condition of forming the c-axis oriented $Pr_1Ba_2Cu_3O_{7-\epsilon}$ thin film and the c-axis oriented $Y_1Ba_2Cu_3O_{7-\delta}$ oxide superconductor thin film 1 by off-axis sputtering is as follows:

| 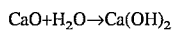 $Pr_1Ba_2Cu_3O_{7-\epsilon}$ thin film | |
|---|---|
| Temperature of the substrate | 750° C. |
| Sputtering Gas | Ar: 90% |
| | $O_2$: 10% |
| Pressure | 10 Pa |
| $Y_1Ba_2Cu_3O_{7-\delta}$ oxide superconductor thin film | |
| Temperature of the substrate | 700° C. |
| Sputtering Gas | Ar: 90% |
| | $O_2$: 10% |
| Pressure | 10Pa |

Figure 1C:
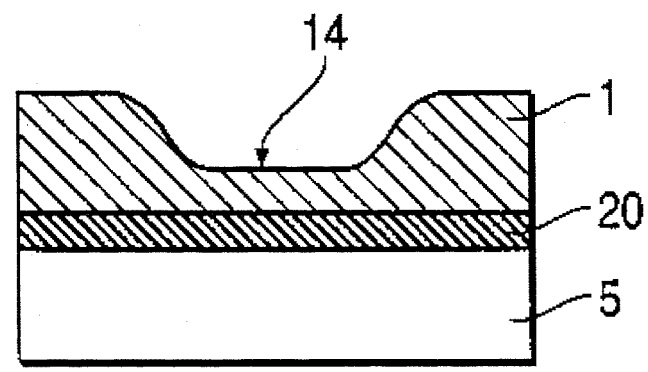

Then, as shown in FIG. 1C, a center portion of the $Y_1Ba_2Cu_3O_{7-\delta}$ oxide superconductor thin film 1 is processed by He ion-beam accelerated by an energy of 3 to 50 keV so as to form a concave portion 14 which is concave gently. The tilt angle of the concave portion 14 is less than 40° and its length is about 100 nanometers.

Figure 1D:
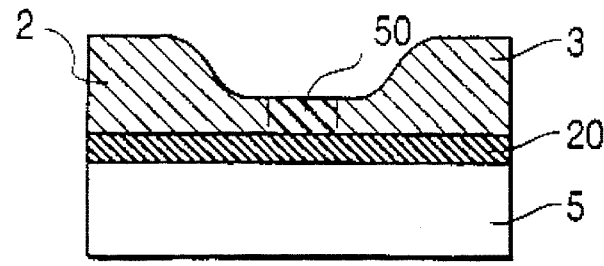

Thereafter, Ga ions are implanted into a bottom portion of the concave portion 14 by an energy of 50 to 150 keV so as to form an insulating region 50, as shown in FIG. 1D. In this connection, Al ions, In ions, Si ions, Ba ions and Cs ions can be also used instead of Ga ions. The $Y_1Ba_2Cu_3O_{7-\delta}$ oxide superconductor thin film 1 is divided into a superconducting source region 2 and a superconducting drain region 3 by the insulating region 50.

Then, the substrate 5 is heated to a temperature of 350° to 400° C. under a pressure lower than $1 \times 10^{-9}$ Torr so as to clean the surface of the $Y_1Ba_2Cu_3O_{7-\delta}$ oxide superconductor thin film 1. This heat-treatment is not necessary, if the surface of the $Y_1Ba_2Cu_3O_{7-\delta}$ oxide superconductor thin film 1 is clean enough.

Figure 1E:
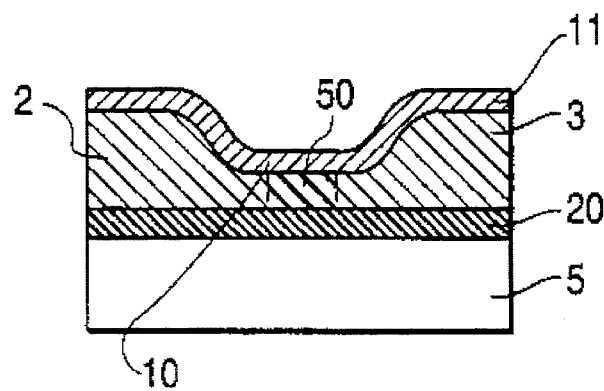

Thereafter, as shown in FIG. 1E, a c-axis oriented $Y_1Ba_2Cu_3O_{7-\delta}$ oxide superconductor thin film 11 having a thickness on the order of about 5 nanometers is deposited on the surface of the $Y_1Ba_2Cu_3O_{7-\delta}$ oxide superconductor thin film 1 by an MBE (molecular beam epitaxy). A condition of forming the c-axis oriented $Y_1Ba_2Cu_3O_{7-\delta}$ oxide superconductor thin film 11 by an MBE is as follows:

| Molecular beam source | Y: 1250° C. |
| --- | --- |
| | Ba: 600° C. |
| | Cu: 1040° C. |
| $O_2$ or $O_3$ atmosphere | |
| Pressure | $1 \times 10^{-5}$ Torr |
| Temperature of the substrate | 700° C. |

Since the $Y_1Ba_2Cu_3O_{7-\delta}$ oxide superconductor thin film 11 is formed on the gently curved surface of the $Y_1Ba_2Cu_3O_{7-\delta}$ oxide superconductor thin film 1, it becomes an uniform c-axis oriented oxide superconductor thin film. A portion of the $Y_1Ba_2Cu_3O_{7-\delta}$ oxide superconductor thin film 11 on the insulating region 50 becomes a superconducting channel.

Figure 1F:
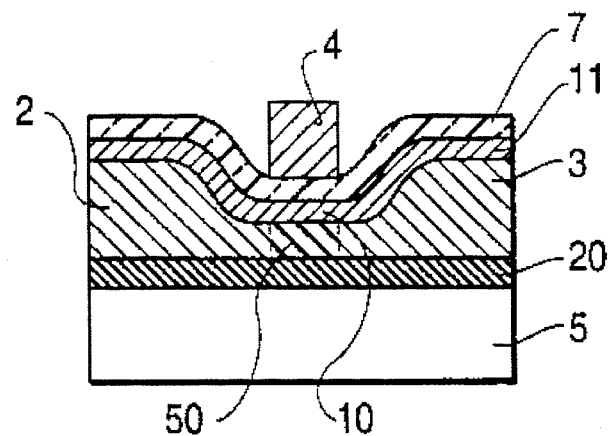

Finally, as shown in FIG. 1F, a gate insulating layer 7 is formed of $Si_3N_4$, MgO or $SrTiO_3$ on the superconducting channel 10 and a gate electrode 4 is formed of Au on the gate insulating layer 7. Metal electrodes may be formed on the superconducting source region 2 and the superconducting drain region 3, if necessary. With this, the super-FET in accordance with the present invention is completed.

As explained above, the superconducting channel, the superconducting source region and the superconducting drain region of the above mentioned super-FET manufactured in accordance with the embodiment of the method of the present invention are formed of c-axis oriented oxide superconductor thin films. Therefore, the super-FET has no undesirable resistance nor undesirable Josephson junction between the superconducting channel and the superconducting source region and between the superconducting channel and the superconducting drain region. In addition, since the superconducting source region and the superconducting drain region gently inclines to the superconducting channel, superconducting current efficiently flows into and flows from the superconducting channel. By this, the current capability of the super-FET can be improved.

In the above method, if the $Y_1Ba_2Cu_3O_{7-\delta}$ oxide superconductor thin film 11 is deposited to have a grain boundary so as to form a weak link of the Josephson junction on the insulating region 50, a Josephson junction device is manufactured. In this case, the superconducting source region and the superconducting drain region are two superconducting electrodes. Almost all the above mentioned features of the super-FET can apply to the Josephson junction device.

Embodiment 2

Figure 2A:
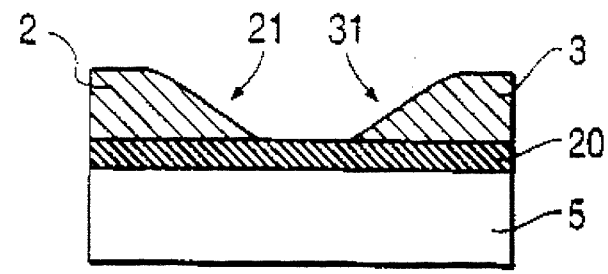
FIGS. 2A to 2C are diagrammatic sectional views for illustrating featured steps of a second embodiment of the process in accordance with the present invention for manufacturing the super-FET.
Figure 2B:
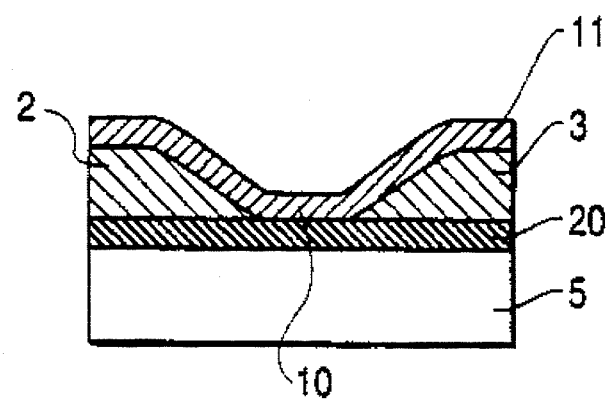
Figure 2C:
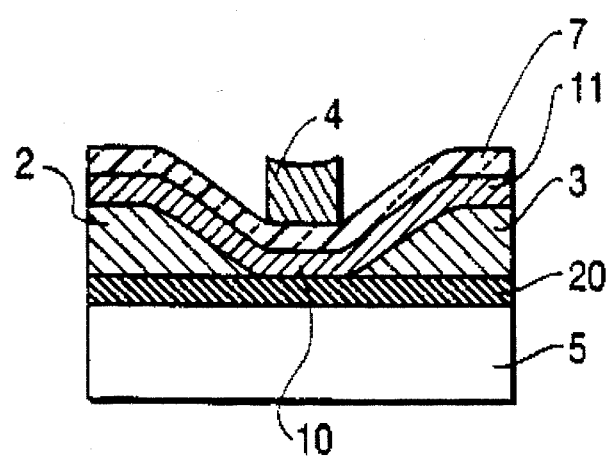

Referring to FIGS. 2A to 2C, a second embodiment of the process for manufacturing the superconducting device will be described.

In this second embodiment, the same processings as those shown in Figures 1A to 1B are performed.

Then, as shown in FIG. 2A, the $Y_1Ba_2Cu_3O_{7-\delta}$ oxide superconductor thin film 1 is processed by He ion-beam accelerated by an energy of 3 to 50 keV so that the $Y_1Ba_2Cu_3O_{7-\delta}$ oxide superconductor thin film 1 is divided into a superconducting source region 2 and a superconducting drain region 3 which have inclined surfaces gently inclined to each other. The tilt angle of the inclined surfaces is less than 40°. The oxide layer 20 of $Pr_1Ba_2Cu_3O_{7-\delta}$ is exposed between the superconducting source region 2 and the superconducting drain region 3.

Then, the substrate 5 is heated to a temperature of 350° to 400° C. under a pressure lower than $1\times10^{-9}$ Torr so as to clean the surfaces of the superconducting source region 2 and the superconducting drain region 3 and the exposed surface of the oxide layer 20. This heat-treatment is not necessary, if the surfaces of the superconducting source region 2 and the superconducting drain region 3 and the exposed surface of the oxide layer 20 are clean enough.

Thereafter, as shown in FIG. 2B, a c-axis oriented $Y_1Ba_2Cu_3O_{7-\delta}$ oxide superconductor thin film 11 having a thickness on the order of about 5 nanometers is deposited on the surfaces of the superconducting source region 2 and the superconducting drain region 3 and the exposed surface of the oxide layer 20 by an MBE (molecular beam epitaxy). A condition of forming the c-axis oriented $Y_1Ba_2Cu_3O_{7-\delta}$ oxide superconductor thin film 11 by an MBE is the same as that of Embodiment 1.

Since the $Y_1Ba_2Cu_3O_{7-\delta}$ oxide superconductor thin film 11 is formed on the gently curved surfaces of the superconducting source region 2 and the superconducting drain region 3 and the exposed surface of the oxide layer 20, it becomes an uniform c-axis oriented oxide superconductor thin film. A portion of the $Y_1Ba_2Cu_3O_{7-\delta}$ oxide superconductor thin film 11 on the exposed surface of the oxide layer 20 becomes a superconducting channel 10.

Finally, as shown in FIG. 2C, a gate insulating layer 7 is formed of $Si_3N_4$, MgO or $SrTiO_3$ on the superconducting channel 10 and a gate electrode 4 is formed of Au on the gate insulating layer 7. Metal electrodes may be formed on the superconducting source region 2 and the superconducting drain region 3, if necessary. With this, the super-FET in accordance with the present invention is completed.

As explained above, the superconducting channel, the superconducting source region and the superconducting drain region of the above mentioned super-FET manufactured in accordance with the embodiment of the method of the present invention are formed of c-axis oriented oxide superconductor thin films. Therefore, the super-FET has no undesirable resistance nor undesirable Josephson junction between the superconducting channel and the superconducting source region and between the superconducting channel and the superconducting drain region. In addition, since the superconducting source region and the superconducting drain region gently inclines to the superconducting channel, superconducting current efficiently flows into and flows from the superconducting channel. By this, the current capability of the super-FET can be improved.

In the above method, if the $Y_1Ba_2Cu_3O_{7-\delta}$ oxide superconductor thin film 11 is deposited to have a grain boundary so as to form a weak link of the Josephson junction on the exposed surface of the oxide layer 20, a Josephson junction device is manufactured. In this case, the superconducting source region and the superconducting drain region are two superconducting electrodes. Almost all the above mentioned features of the super-FET can apply to the Josephson junction device.

Embodiment 3

Referring to FIGS. 3A to 3J, a third embodiment of the process for manufacturing the superconducting device will be described.

Figure 3A:
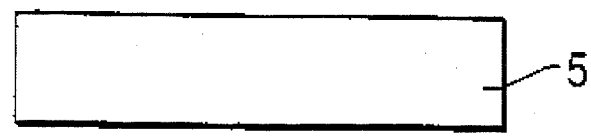
FIGS. 3A to 3J are diagrammatic sectional views for illustrating a third embodiment of the process in accordance with the present invention for manufacturing the super-FET.
Figure 3B:
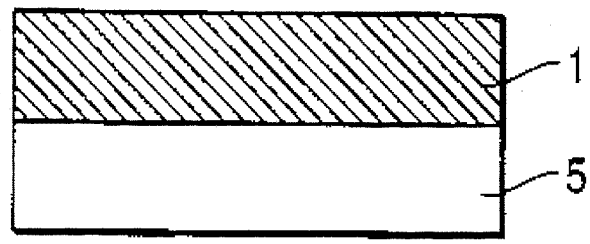

As shown FIG. 3A, an MgO (100) substrate 5 similar to that of Embodiment 1 is prepared. As shown in FIG. 3B, a c-axis oriented $Y_1Ba_2Cu_3O_{7-\delta}$ oxide superconductor thin film I having a thickness of about 250 nanometers is deposited on a principal surface of a MgO substrate 5, by for example a sputtering, an MBE (molecular beam epitaxy), a vacuum evaporation, a CVD, etc. A condition of forming the c-axis oriented $Y_1Ba_2Cu_3O_{7-\delta}$ oxide superconductor thin film 1 by off-axis sputtering is as follows:

| | |
|---|---|
| Temperature of the substrate | 700° C. |
| Sputtering Gas | Ar: 90% |
| | $O_2$: 10% |
| Pressure | $5 \times 10^{-2}$ Torr |

Figure 3C:
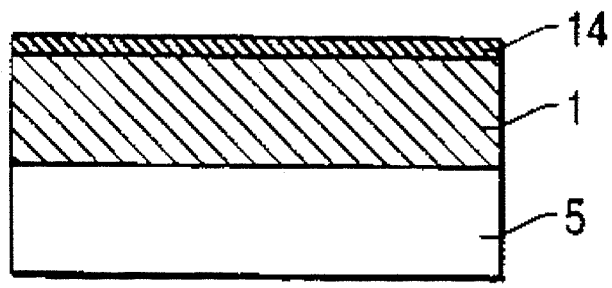
Figure 3D:
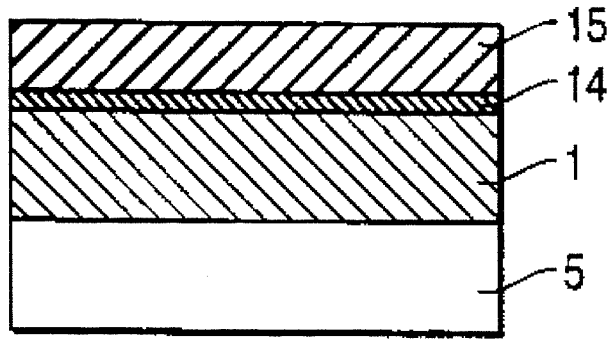
Figure 3E:
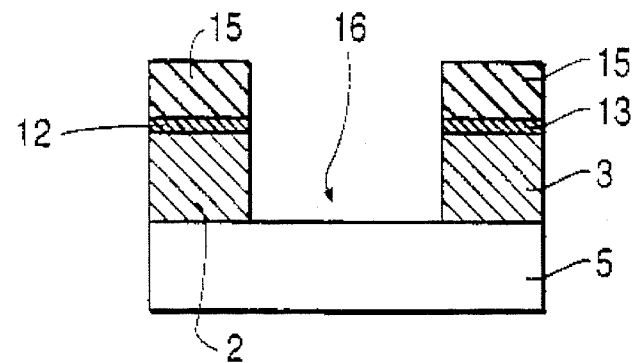

Then, as shown in FIG. 3C, an Au layer 14 having a thickness of 30 to 100 nanometers is formed on the $Y_1Ba_2Cu_3O_{7-\delta}$ oxide superconductor thin film 1. As shown in FIG. 3D, a $SiO_2$ layer 15 having a thickness of 250 nanometers is formed on the Au layer 14 by a CVD. A center portion of the $SiO_2$ layer 15 is removed by using a photolithography. Using the processed $SiO_2$ layer 15 as a mask, center portions of the Au layer 14 and the $Y_1Ba_2Cu_3O_{7-\delta}$ oxide superconductor thin film I are selectively etched by a reactive ion etching using a chloric gas, an ion milling using Ar-ions or a focused ion beam etching so that the Au layer 14 is divided into a source electrode 12 and a drain electrode 13, the $Y_1Ba_2Cu_3O_{7-\delta}$ oxide superconductor thin film 1 is divided into a superconducting source region 2 and a superconducting drain region 3, and a portion 16 of the surface of the substrate 5 is exposed between them, as shown in FIG. 3E.

Figure 3F:
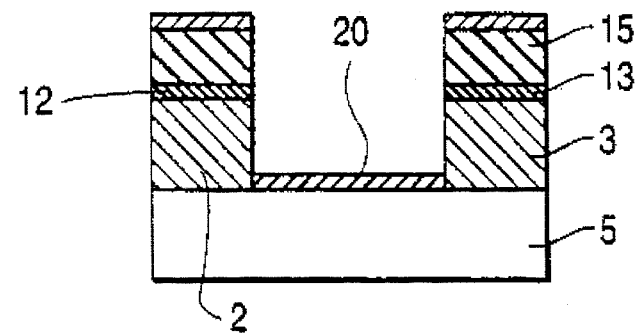

Then, the substrate 5 is heated to a temperature of 350° to 400° C. under a pressure lower than $1\times10^{-9}$ Torr so as to clean the exposed surface 16 of the substrate 5. This heat-treatment is not necessary, if the exposed surface 16 of the substrate 5 is clean enough. As shown in FIG. 3F, an oxide layer 20 composed of c-axis oriented $Pr_1Ba_2Cu_3O_{7-\delta}$ is deposited on the exposed surface 16 of the substrate 5, by an MBE. The oxide layer 20 preferably has a half thickness of the superconducting source region 2 and the superconducting drain region 3. While the $Pr_1Ba_2Cu_3O_{7-\delta}$ thin film 20 is growing, the surface morphology of the $Pr_1Ba_2Cu_3O_{7-\delta}$ thin film 20 is monitored by RHEED. A condition of forming the c-axis oriented $Pr_1Ba_2Cu_3O_{7-\delta}$ oxide thin film 20 by MBE is as follows:

| Molecular beam source | Pr: 1225° C. |
| --- | --- |
| | Ba: 600° C. |
| | Cu: 1040° C. |
| Pressure | $1 \times 10^{-5}$ Torr |
| Temperature of the substrate | 750° C. |

Figure 3G:
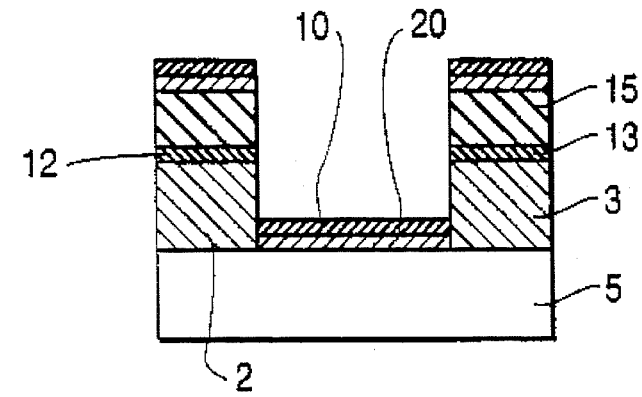

Then, the Pr molecular beam source is exchanged to a Y molecular beam source and the temperature of the substrate is lowered to 700° C. so that a superconducting channel 10 of a c-axis oriented $Y_1Ba_2Cu_3O_{7-\delta}$ oxide superconductor thin film having a thickness of about 5 nanometer is continuously formed on the oxide layer 20 of $Pr_1Ba_2Cu_3O_{7-\delta}$ thin film, as shown in FIG. 3G.

Figure 3H:
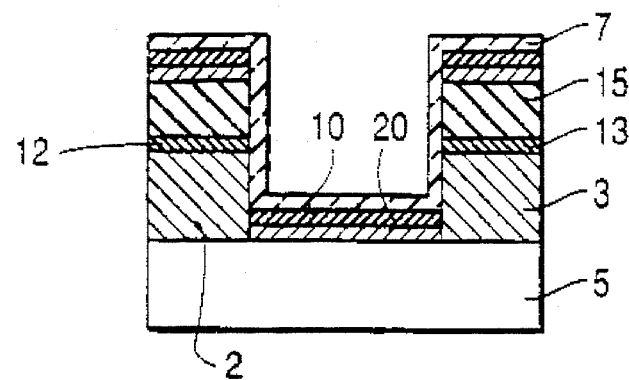

Thereafter, as shown in FIG. 3H, a gate insulating layer 7 of MgO is formed by a sputtering successively on the superconducting source region 2, the superconducting channel 10 and the superconducting drain region 3. The gate insulating layer 7 has a thickness of 10 to 20 nanometers and covers side surfaces of the superconducting source region 2 and the superconducting drain region 3 for their insulation.

Figure 3I:
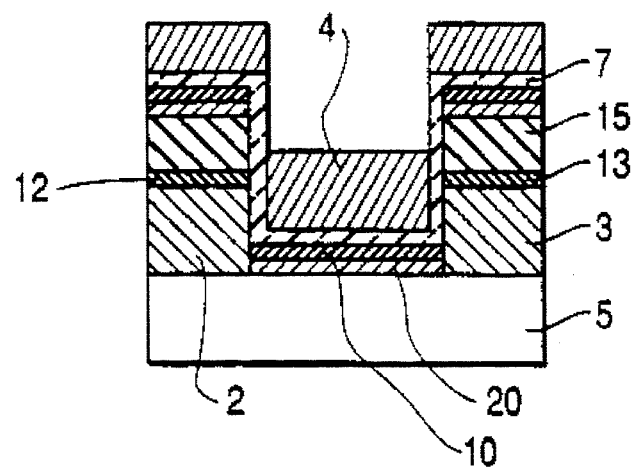

Then, as shown in FIG. 3I, a gate electrode 4 of Au is formed on a center portion of the gate insulating layer 7 by a vacuum evaporation.

Figure 3J:
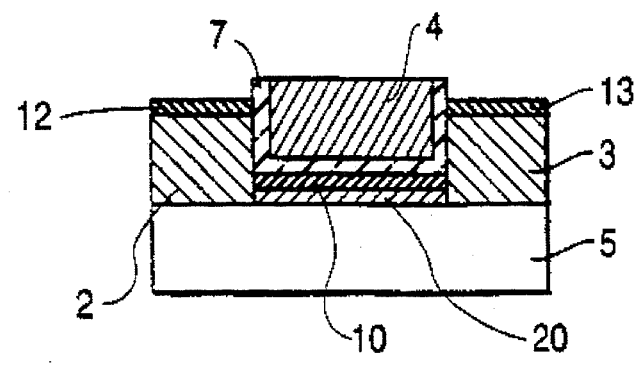

Finally, as shown in FIG. 3J, the $SiO_2$ layer 15 is removed by using a 10% HF solution. Metal layers are formed on the source electrode 12 and the drain electrode 13 respectively, so as to planarize the upper surface of the device, if necessary. With this, the super-FET in accordance with the present invention is completed.

The above mentioned super-FET manufactured in accordance with the third embodiment of the method of the present invention has a superconducting channel which is formed on the $Pr_1Ba_2Cu_3O_{7-\delta}$ non-superconducting oxide layer of which the crystal structure is similar to that of the $Y_1Ba_2Cu_3O_{7-\delta}$ oxide superconductor. Therefore, the bottom portion of the superconducting channel is not degraded so that the substantial cross-sectional area of the superconducting channel of the super-FET is larger than that of a conventional super-FET.

Additionally, since the superconducting channel is connected to the superconducting source region and the superconducting drain region at the height of their middle portions, superconducting current efficiently flows into and flows from the superconducting channel. By all of these, the current capability of the super-FET can be improved.

In addition, since the substantially planarized upper surface is obtained, it become easy to form conductor wirings in a later process.

Furthermore, according to the method of the present invention, the oxide layer, the superconducting channel, the gate insulating layer and the gate electrode are self-aligned.

In the above method, since the oxide superconductor thin films are covered during the etching process, the superconducting characteristics of the oxide superconductor thin films are not affected. Therefore, the limitation in the fine processing technique required for manufacturing the super-FET is relaxed, and the manufactured super-FET has a excellent performance.

Embodiment 4

Referring to FIGS. 4A to 4J, a forth embodiment of the process for manufacturing the superconducting device will be described.

Figure 4A:
FIGS. 4A to 4J am diagrammatic sectional views for illustrating a forth embodiment of the process in accordance with the present invention for manufacturing the super-FET.
Figure 4B:
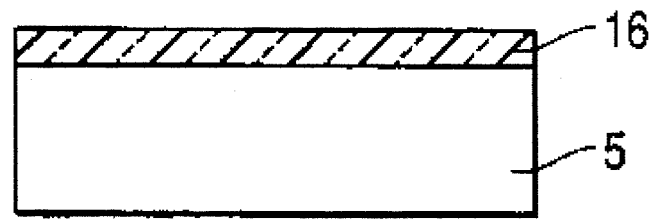

As shown FIG. 4A, an MgO (100) substrate 5 similar to that of Embodiment 1 is prepared. As shown in FIG. 4B, a lift-off layer 16 of a CaO layer having a thickness of 1 μm covered with Zr layer having a thickness of 50 nanometers is deposited on the substrate 5.

Figure 4C:
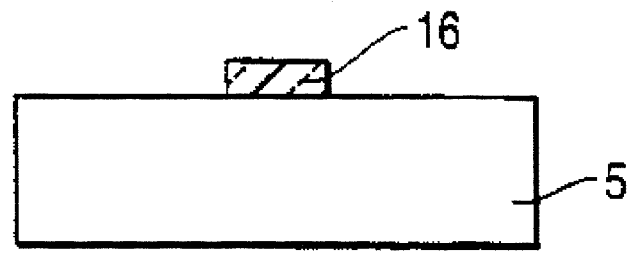
Figure 4D:
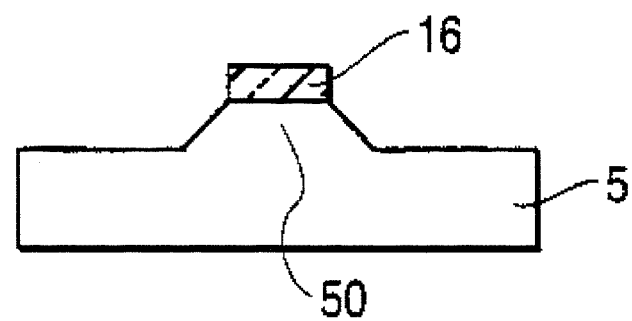

Then as shown in FIG. 4C, the lift-off layer 16 is removed excluding a portion at which a insulating region will be positioned. The lift-off layer 16 can be processed by a dry etching using a photoresist or a lift-off.

Thereafter, the principal surface of the substrate 5 is etched by a reactive ion etching, ion milling using Ar ions etc. In this etching process, the remaining lift-off layer 16 is used as a mask so that a projecting insulating region 50 of which the cross section is a shape of a trapezoid is formed on the substrate.

Then, the substrate 5 is heated to a temperature of 350° to 400° C. under a pressure lower than $1\times10^{-9}$ Torr so as to clean the etched surface of the substrate 5.

Figure 4E:
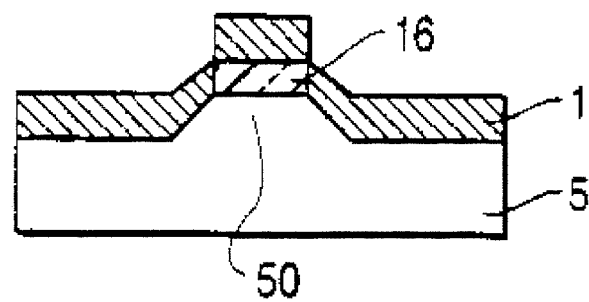

Thereafter, as shown in FIG. 4E, a $Y_1Ba_2Cu_3O_{7-\delta}$ oxide superconductor thin film 1 having a thickness on the order of 200 to 300 nanometers is deposited on the etched surface of the substrate 5 and the lift-off layer 16. The $Y_1Ba_2Cu_3O_{7-\delta}$ oxide superconductor thin film 1 is preferably formed by an MBE (molecular beam epitaxy). A condition of forming the $Y_1Ba_2Cu_3O_{7-\delta}$ oxide superconductor thin film 1 by an MBE is as follows:

| Molecular beam source | Y: 1250° C. |
| --- | --- |
| | Ba: 600° C. |
| | Cu: 1040° C. |
| $O_2$ or $O_3$ atmosphere | |
| Pressure | $1 \times 10^{-5}$ Torr |
| Temperature of the substrate | 680° C. |

Figure 4F:
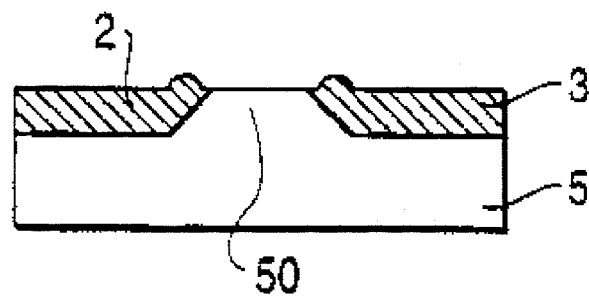

Then, the lift-off layer 16 is removed so that the $Y_1Ba_2Cu_3O_{7-\delta}$ oxide superconductor thin film 1 is divided into a superconducting source region 2 and a superconducting drain region 3 and the insulating region 50 is exposed, as shown in FIG. 4F. This lift-off process utilizes water and a following reaction:

$$CaO + H_2O \rightarrow Ca(OH)_2$$

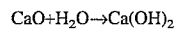

Since the lift-off process does not use an agent of high reactivity but use only water, the $Y_1Ba_2Cu_3O_{7-\delta}$ oxide superconductor thin film I and the substrate 5 are not degraded.

Thereafter, the substrate 5 is again heated to a temperature of 350° to 400° C. under a pressure lower than $1\times10^{-9}$ Torr so as to clean the exposed insulating region 50, the superconducting source region 2 and the superconducting drain region 3.

Figure 4G:
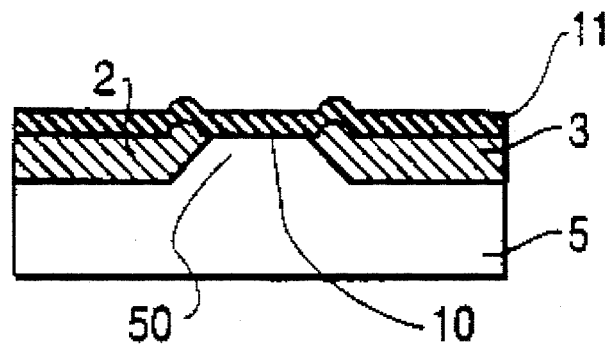

Then, a c-axis oriented $Y_1Ba_2Cu_3O_{7-\delta}$ oxide superconductor thin film 11 having a thickness of 5 nanometers is deposited on the insulating region 50 by an MBE, as shown in FIG. 4G. A condition of forming the $Y_1Ba_2Cu_3O_{7-\delta}$ oxide superconductor thin film 11 by an MBE is as follows:

| Molecular beam source | Y: 1250° C. |
| --- | --- |
|  | Ba: 600° C. |
|  | Cu: 1040° C. |
| Pressure | $1 \times 10^{-5}$ Torr |
| Temperature of the substrate | 700° C. |

A portion of the deposited $Y_1Ba_2Cu_3O_{7-\delta}$ oxide superconductor thin film 11 on the insulating region 50 becomes a superconducting channel 10.

Figure 4H:
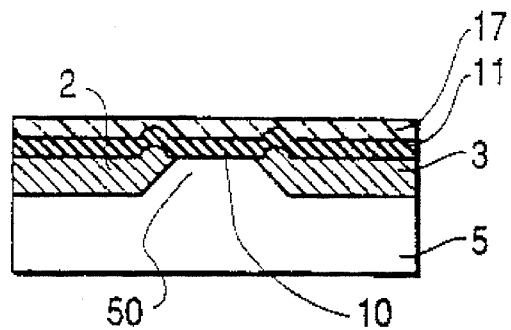
Figure 4I:
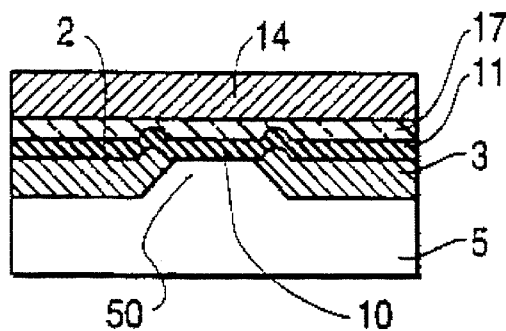
Figure 4J:
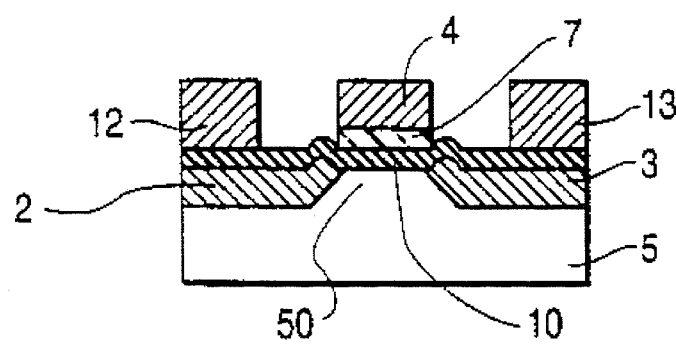

Then, a insulating layer 17 is formed of $Si_3N_4$, MgO or $SrTiO_3$ on the $Y_1Ba_2Cu_3O_{7-\delta}$ oxide superconductor thin film 1 1, as shown in FIG. 4H, and an Au layer 14 on the insulating layer 17, as shown in FIG. 4I.

Finally, the Au layer 14 is processed into a gate electrode 4, the insulating layer 17 is processed into a gate insulating layer 7, and the source electrode 12 and the drain electrode 13 are formed of Au on the superconducting source region 2 and superconducting drain region 3. With this, he super-FET in accordance with the present invention is completed.

The above mentioned super-FET manufactured in accordance with the forth embodiment of the method of the present invention has the substantially planarized upper surface, it become easy to form conductor wirings in a later process.

Furthermore, according to the method of file present invention, the superconducting channel is formed without using etching. Thus, the superconducting channel is not affected. Therefore, the limitation in the fine processing technique required for manufacturing the super-FET is relaxed, and the manufactured super-FET has a excellent performance.

In the above mentioned embodiment, the oxide superconductor thin film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting device, comprising:

a substrate having a principal surface;

a non-superconducting oxide layer having a crystal structure similar to that of an oxide superconductor;

a superconducting source region and a superconducting drain region formed of a c-axis oriented oxide superconductor thin film separated by an insulating region positioned between them;

an extremely thin superconducting channel formed of a c-axis oriented oxide superconductor thin film on said insulating region, said superconducting channel electrically connecting said superconducting source region to said superconducting drain region so that superconducting current can flow through said superconducting channel between said superconducting source region and said superconducting drain region; and a gate electrode formed through a gate insulator on said superconducting channel, said gate electrode controlling said superconducting current flowing through said superconducting channel, wherein said superconducting source region, said superconducting drain region and said insulating region comprise one continuous c-axis oriented oxide superconductor thin film which has a gently concave upper surface so that said superconducting source region and said superconducting drain region are connected to said superconducting channel without resistivity or Josephson junction and a center portion of said c-axis oriented oxide superconductor thin film includes an impurity concentration sufficient to inhibit superconductivity.

2. A superconducting device chimed in claim 1 wherein said non-superconducting oxide layer has a crystal structure similar to that of a c-axis oriented oxide superconductor thin film.

3. A superconducting device claimed in claim 1 wherein said non-superconducting oxide layer is formed of a $Pr_1Ba_2Cu_3O_{7-\delta}$ thin film.

4. A superconducting device claimed in claim 1 wherein said oxide superconductor is formed of high-$T_c$ (high critical temperature) oxide superconductor, particularly, formed of a high-$T_c$ copper-oxide type compound oxide superconductor.

5. A superconducting device claimed in claim 4 wherein said oxide superconductor is formed of oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

6. A superconducting device chimed in claim 1 wherein said substrate is formed of a material selected from the group consisting of a MgO (100) substrate, a $SrTiO_3$ (100) substrate and a $CdNdAlO_4$ (001) substrate, and a semiconductor substrate.

7. A superconducting device claimed in claim 6 wherein said substrate is formed of a silicon substrate and a principal surface of said silicon substrate is coated with an insulating material layer which is formed of a $MgAl_2O_4$ layer and a $BaTiO_3$ layer.

8. A superconducting device, comprising:

a substrate having a principal surface;

a non-superconducting oxide layer having a crystal structure similar to that of an oxide superconductor;

two superconducting regions formed of a c-axis oriented oxide superconductor thin film separated by an insulating region positioned between them; and an extremely thin superconducting region formed of a c-axis oriented oxide superconductor thin film on said insulating region which is continuous to said two superconducting regions and forms a weak link of a Josephson junction, wherein said two superconducting regions and said insulating region comprise one continuous c-axis oriented oxide superconductor thin film which has a gently concave upper surface so that said superconducting source region and said superconducting drain region are connected to said extremely thin superconducting region without resistivity or Josephson junction and wherein a center portion of said one continuous c-axis oriented oxide thin film includes an impurity concentration sufficient to inhibit superconductivity to form said insulating region.

9. A superconducting device claimed in claim 8, wherein said non-superconducting oxide layer has a crystal structure similar to that of a c-axis oriented oxide superconductor thin film.

10. A superconducting device claimed in claim 8, wherein said non-superconducting oxide layer is formed of a $Pr_1Ba_2Cu_3O_{7-\delta}$ thin film.

11. A superconducting device claimed in claim 8, wherein said oxide superconductor is formed of a high-$T_c$ (high critical temperature) oxide superconductor.

12. A superconducting device claimed in claim 11, wherein said oxide superconductor is formed of an oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

13. A superconducting device claimed in claim 11, wherein said oxide superconductor is formed of a high-$T_c$ copper-oxide type compound oxide superconductor.

14. A superconducting device claimed in claim 8, wherein said substrate is formed of a material selected from the group consisting of MgO (100), $SrTiO_3$ (100), and $CdNdAlO_4$ (001).

15. A superconducting device claimed in claim 14, wherein said substrate is formed of silicon and a principal surface of said substrate is coated with an insulating material layer which is formed of a $MgAl_2O_4$ layer and a $BaTiO_3$ layer.

16. A superconducting device claimed in claim 8, wherein said substrate is a semiconductor substrate.

* * * * *